United States Patent
Babenko et al.

(10) Patent No.: US 10,953,467 B2
(45) Date of Patent: Mar. 23, 2021

(54) POROUS MATERIALS COMPRISING TWO-DIMENSIONAL NANOMATERIALS

(71) Applicants: Oxford University Innovation Limited, Oxford (GB); Vitaliy Babenko, Oxford (GB); Nicole Grobert, Oxford (GB)

(72) Inventors: Vitaliy Babenko, Oxford (GB); Nicole Grobert, Oxford (GB)

(73) Assignee: Oxford University Innovation Limited, Oxford (GB)

( * ) Notice: Subject to any disclaimer, the term of this patent is extended or adjusted under 35 U.S.C. 154(b) by 606 days.

(21) Appl. No.: 15/500,664

(22) PCT Filed: Jul. 31, 2015

(86) PCT No.: PCT/GB2015/052225
§ 371 (c)(1),
(2) Date: Jan. 31, 2017

(87) PCT Pub. No.: WO2016/016660
PCT Pub. Date: Feb. 4, 2016

(65) Prior Publication Data
US 2017/0216923 A1    Aug. 3, 2017

(30) Foreign Application Priority Data
Aug. 1, 2014 (GB) .................... 1413701.2

(51) Int. Cl.
*C23C 16/26* (2006.01)
*C23C 16/04* (2006.01)
(Continued)

(52) U.S. Cl.
CPC .............. *B22F 7/002* (2013.01); *B01J 21/18* (2013.01); *B01J 23/72* (2013.01); *B01J 23/755* (2013.01);
(Continued)

(58) Field of Classification Search
CPC ....... C23C 16/26; C23C 16/342; C23C 16/56; B22F 7/002
See application file for complete search history.

(56) References Cited

U.S. PATENT DOCUMENTS

| | | |
|---|---|---|
| 2013/0045385 A1 | 2/2013 | Kim et al. |
| 2015/0104634 A1* | 4/2015 | Lee .................. C01B 32/182 |
| | | 428/312.8 |

FOREIGN PATENT DOCUMENTS

| | | |
|---|---|---|
| CN | 101831622 A | 9/2010 |
| CN | 102675880 A | 9/2012 |

(Continued)

OTHER PUBLICATIONS

Trinsoutrot et al. Three dimensional graphene synthesis on nickel foam by chemical vapor deposition from ethylene, Mat Sci Eng B 179 (2014) pp. 12-16. (Year: 2014).*

(Continued)

*Primary Examiner* — Kelly M Gambetta
(74) *Attorney, Agent, or Firm* — Hodgson Russ LLP

(57) ABSTRACT

According to the present invention, there are provided processes for preparing a porous composite material comprising a metal and a two-dimensional nanomaterial. In one aspect, the processes comprise the steps of: providing a powder comprising metal particles; heating the powder such that the metal particles fuse to form a porous scaffold; and forming a two-dimensional nanomaterial on a surface of the porous scaffold by chemical vapour deposition (CVD). Also provided are materials obtainable by the present processes, and products comprising said materials.

18 Claims, 4 Drawing Sheets

(51) Int. Cl.
| | | |
|---|---|---|
| C23C 16/01 | (2006.01) | |
| C23C 16/34 | (2006.01) | |
| B22F 7/00 | (2006.01) | |
| B22F 3/24 | (2006.01) | |
| C22C 1/08 | (2006.01) | |
| C01B 21/064 | (2006.01) | |
| B22F 3/11 | (2006.01) | |
| C01B 32/194 | (2017.01) | |
| C01B 32/186 | (2017.01) | |
| B01J 21/18 | (2006.01) | |
| B01J 23/72 | (2006.01) | |
| B01J 23/755 | (2006.01) | |
| B01J 27/24 | (2006.01) | |
| B01J 35/00 | (2006.01) | |
| B01J 37/02 | (2006.01) | |
| B01J 37/08 | (2006.01) | |
| B22F 1/00 | (2006.01) | |
| B22F 3/26 | (2006.01) | |
| C23C 16/56 | (2006.01) | |
| C23F 1/10 | (2006.01) | |
| H01B 1/04 | (2006.01) | |
| H01B 1/06 | (2006.01) | |
| H01B 13/34 | (2006.01) | |
| H01G 11/30 | (2013.01) | |
| H01G 11/36 | (2013.01) | |
| H01G 11/86 | (2013.01) | |
| H01M 4/04 | (2006.01) | |
| H01M 4/133 | (2010.01) | |
| H01M 4/136 | (2010.01) | |
| H01M 4/1393 | (2010.01) | |
| H01M 4/1397 | (2010.01) | |
| H01M 4/583 | (2010.01) | |
| H01M 10/0525 | (2010.01) | |
| H01M 4/02 | (2006.01) | |

(52) U.S. Cl.
CPC ......... *B01J 27/24* (2013.01); *B01J 35/0006* (2013.01); *B01J 37/0225* (2013.01); *B01J 37/08* (2013.01); *B22F 1/0014* (2013.01); *B22F 1/0018* (2013.01); *B22F 3/11* (2013.01); *B22F 3/1109* (2013.01); *B22F 3/1137* (2013.01); *B22F 3/1146* (2013.01); *B22F 3/24* (2013.01); *B22F 3/26* (2013.01); *C01B 21/064* (2013.01); *C01B 32/186* (2017.08); *C01B 32/194* (2017.08); *C22C 1/08* (2013.01); *C23C 16/01* (2013.01); *C23C 16/045* (2013.01); *C23C 16/26* (2013.01); *C23C 16/342* (2013.01); *C23C 16/56* (2013.01); *C23F 1/10* (2013.01); *H01B 1/04* (2013.01); *H01B 1/06* (2013.01); *H01B 13/34* (2013.01); *H01G 11/30* (2013.01); *H01G 11/36* (2013.01); *H01G 11/86* (2013.01); *H01M 4/0428* (2013.01); *H01M 4/0471* (2013.01); *H01M 4/133* (2013.01); *H01M 4/136* (2013.01); *H01M 4/1393* (2013.01); *H01M 4/1397* (2013.01); *H01M 4/583* (2013.01); *H01M 10/0525* (2013.01); *B22F 2003/242* (2013.01); *B22F 2003/244* (2013.01); *B22F 2003/248* (2013.01); *B22F 2301/10* (2013.01); *B22F 2301/15* (2013.01); *B22F 2302/45* (2013.01); *B22F 2304/05* (2013.01); *B22F 2304/10* (2013.01); *B22F 2304/15* (2013.01); *B22F 2998/10* (2013.01); *B22F 2999/00* (2013.01); *H01M 2004/021* (2013.01)

(56) References Cited

FOREIGN PATENT DOCUMENTS

| | | |
|---|---|---|
| CN | 102732037 A | 10/2012 |
| CN | 102786756 A | 11/2012 |
| CN | 103215469 | * 7/2013 |
| CN | 103215469 A | 7/2013 |
| CN | 103910340 A | 7/2014 |
| WO | 2012/144993 A1 | 10/2012 |
| WO | 2013/180662 A1 | 12/2013 |

OTHER PUBLICATIONS

Jiang et al., Design of advanced porous graphene materials: from graphene nanomesh to 3D architectures, Nanoscale, Oct. 16, 2013, vol. 6, No. 4, pp. 1922-1945.

* cited by examiner

POROUS MATERIALS COMPRISING TWO-DIMENSIONAL NANOMATERIALS

The work leading to this invention has received funding from the European Research Council under the European Community's Seventh Framework Programme (FP7/2007-2013)/ERC grant agreement no 240500.

FIELD OF THE INVENTION

This invention relates to processes for the production of porous materials comprising two-dimensional nanomaterials, as well as to materials derived therefrom. More particularly, the present invention relates to processes for the production of porous composite materials comprising a two-dimensional nanomaterial and a metal, as well as to porous two-dimensional nanomaterials derived therefrom. The invention also relates to materials prepared by the present processes and products comprising the same.

BACKGROUND TO THE INVENTION

Graphene and other two-dimensional nanomaterials are promising candidates for use in a wide variety of applications such as transparent flexible electrodes, photonic devices, energy storage, gas sensors and filters, transistors, coatings and solar energy. Superior quality graphene is highly sought due to the many desirable properties that it possesses. However, the properties of graphene depend greatly on the quality of the synthesised material and the underlying substrate.

Hexagonal boron nitride (hBN) is another two-dimensional nanomaterial having desirable properties, including good electrical insulation, high resistance to oxidation, chemical inertness, high thermal conductivity and high thermal stability. These ceramic-like properties make hBN potentially suited to biological applications where inert, porous structures are required.

Researchers have explored the possibility of improving the properties of graphene and other two-dimensional nanomaterials using a variety of different approaches. For instance, graphene aerogels, ceramic and metallic composites, foams, coatings, inks and papers have been prepared. Graphene-metal composite materials in particular show improved tensile properties, conductivity and corrosion resistance. Porous graphene has also received significant interest as it possesses a high surface area, a high pore volume and the inherent properties of graphene. Porous graphene may be suitable for a multitude of application, e.g. as an electrode material for energy storage devices such as batteries (e.g. lithium air batteries) and capacitors.

A number of processes for preparing porous materials comprising two-dimensional nanomaterials are known in the art. For example, powder processing techniques and chemical restructuring techniques may be used (for a review of such processes, see e.g. Jiang et al., Nanoscale, 2014, 6, 1922-1945 and the references cited therein). However, such techniques are not readily scalable and cannot be used to produce high quality materials in bulk at low cost.

There exists a need in the art for improved processes for producing porous materials comprising two-dimensional nanomaterials. There also exists a need for porous materials comprising two-dimensional nanomaterials having improved properties.

SUMMARY OF THE INVENTION

According to a first aspect of the present invention, there is provided a process for preparing a porous composite material comprising a metal and a two-dimensional nanomaterial, said process comprising the steps of:
   providing a powder comprising metal particles;
   heating the powder such that the metal particles fuse to form a porous scaffold; and
   forming a two-dimensional nanomaterial on a surface of the porous scaffold by chemical vapour deposition (CVD).

In another aspect, the present invention provides a process for preparing a porous composite material comprising a metal and a two-dimensional nanomaterial, said process comprising:
   providing a porous scaffold, wherein the porous scaffold is obtainable by heating a powder comprising metal particles such that the metal particles fuse to form said porous scaffold; and
   forming a two-dimensional nanomaterial on a surface of the porous scaffold by CVD.

In embodiments, the present processes further comprise a step of removing the metal from at least a portion of the porous composite material. In other embodiments, the present processes further comprise a step of reducing the porosity of the porous composite material.

In other aspects, the present invention provides materials obtainable by the present processes, and products comprising said materials.

The present invention also provides a process for preparing a porous scaffold upon which a two-dimensional nanomaterial can be formed, the process comprising:
   providing a powder comprising metal particles; and
   heating the powder such that the metal particles fuse to form a porous scaffold.

The processes and materials of the present invention may be advantageous in a number of respects. Since the present processes involve the use of metal powders, they may be relatively inexpensive to conduct and may be readily scalable. Moreover, by forming the two-dimensional nanomaterials using CVD, high quality two-dimensional nanomaterials, such as graphene, boron nitride, transition metal chalcogenides and derivatives thereof, may be obtained. In addition, the properties of the materials, e.g. the number of layers, the crystallinity, the substrate coverage, the morphology, the porosity and/or the mechanical, chemical and electrical properties, can be controlled. The materials obtained by the present processes may also exhibit desirable properties that can be exploited in a variety of applications.

DESCRIPTION OF VARIOUS EMBODIMENTS

Figure 1:
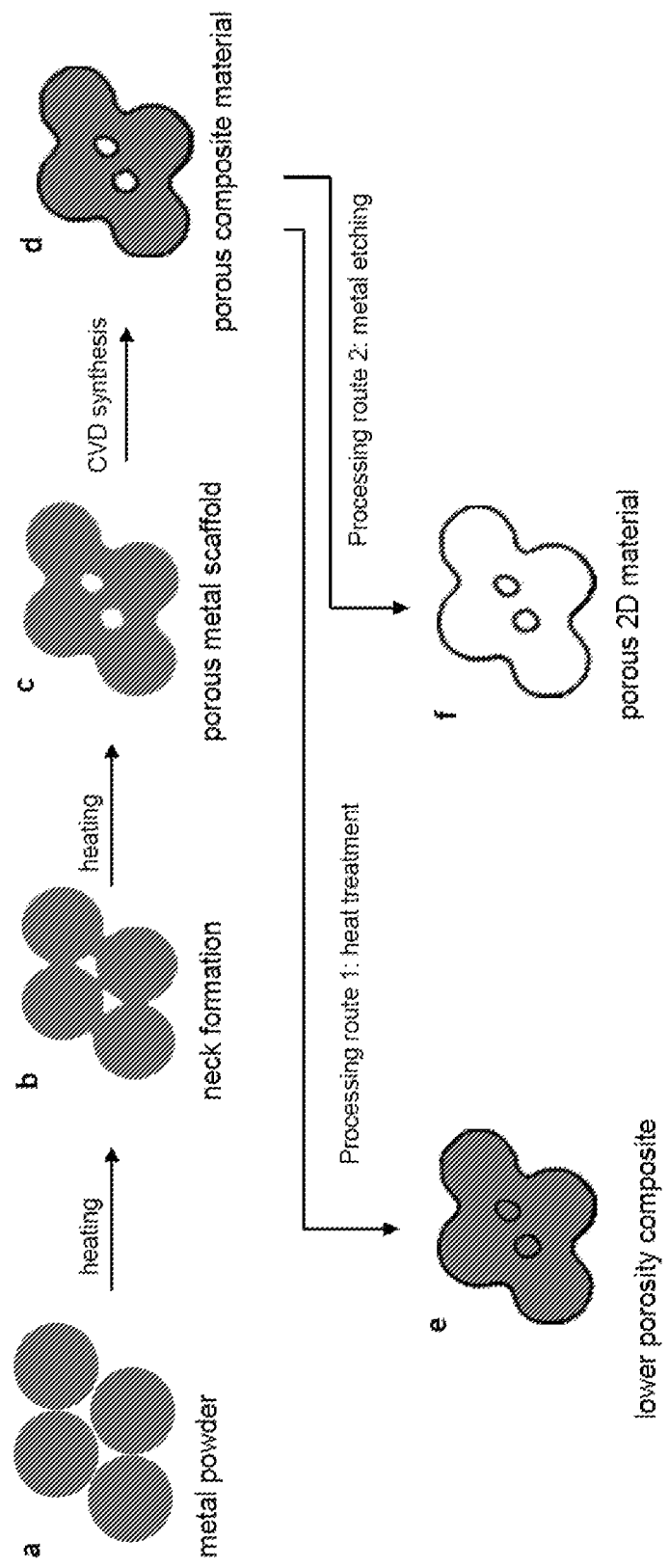
FIG. 1 is a schematic diagram illustrating various processes in accordance with the present invention.

The present invention provides processes for producing porous composite materials comprising a metal and a two-dimensional nanomaterial, as well as processes for the production of other materials derived therefrom.

The present processes involve the use of a porous scaffold upon which a two-dimensional nanomaterial is deposited using CVD. The porous scaffold is obtained by heating a powder comprising metal particles such that the metal particles fuse to form a three-dimensional porous structure upon which growth of the two-dimensional nanomaterial can take place.

The metal particles may comprise a metal which catalyses formation of the two-dimensional nanomaterial via CVD. Preferably, the metal particles include particles of a transition metal, e.g. copper or nickel. The metal particles may be formed of a single metal or an alloy of two or more metals. More preferably, the powder includes copper particles, nickel particles or a mixture thereof.

In an embodiment, the powder is a metal powder which consists essentially of particles of a single metal. In an embodiment, the powder is a substantially pure metal powder, e.g. a metal powder having a purity of at least 90%, e.g. at least 95%. Preferably the metal powder has a purity of at least 98%, e.g. at least 99%, e.g. at least 99.5%. In an embodiment, the powder is a metal powder which consists of particles of a single metal. In an embodiment, the powder is a copper powder or a nickel powder.

In another embodiment, the powder is a metal powder which consists essentially of particles of two of more metals, e.g. a metal powder consisting of copper particles and nickel particles. In an embodiment, the powder is a metal powder which consists of particles of two or more metals. In an embodiment, the powder consists of copper and nickel particles.

The metal particles may be spherical, dendritic, regularly shaped or irregularly shaped particles. Preferably the metal particles are substantially spherical in shape. The metal particles present in the powder may be of differing sizes or they may all be substantially of the same size. In an embodiment, the average particle size of the metal particles is from about 1 nm to about 1 mm, e.g. from about 100 nm to about 100 µm. In a preferred embodiment, the average particle size of the metal particles is from about 50 nm to about 500 nm. Metal powders suitable for use in the present invention are readily available from commercial sources.

In order to form the porous scaffold, the powder comprising the metal particles is heated so that the metal particles fuse to form a three-dimensional structure. The metal particles typically fuse via a process which involves the initial formation of thin necks between the particles, which necks thicken as the powder is heated further.

In an embodiment, the powder is heated to a temperature of from about 900° C. to about 1100° C., e.g. from about 1000° C. to about 1050° C. In an embodiment, the powder is heated for a period of about 5 minutes to about 5 hours, e.g. from about 20 minutes to about 1 hour.

The powder will typically be held in a container which is introduced into a suitable reaction chamber where heating takes place. In a preferred embodiment of the invention, heating of the powder takes place in the reaction chamber of a CVD apparatus, which is preferably the same CVD chamber as that which is used to form the two-dimensional nanomaterial.

Heating of the powder may be performed under hydrogen gas to remove carbonaceous contaminants or other contaminants. The removal of such contaminants may improve the quality of the resulting two-dimensional nanomaterial, e.g. it may reduce the number of layers of the two-dimensional nanomaterial obtained.

The geometry of the porous scaffold may be controlled by altering the timing and temperature of heating. The macroscopic shape of the porous scaffold will be determined by the shape of the container in which the powder is held. The container may be formed of a ceramic material such as alumina, fused silica or boron nitride. More preferably the container is formed of a porous ceramic material, as a porous ceramic material container may facilitate gas flow through the powder.

In an embodiment, the porous scaffold is removed from the reaction chamber and optionally characterised before forming the two-dimensional nanomaterial thereon.

In an embodiment, the average width of the necks formed between particles is from about 1 µm to about 50 µm, e.g. from about 1 µm to about 20 µm, e.g. from about 1 µm to about 10 µm, e.g. about 10 µm.

Once the porous scaffold has been formed, a two-dimensional nanomaterial can then be deposited on the scaffold by CVD. Two-dimensional nanomaterials generally comprise one or more atomically thin crystalline repeating units referred to as monolayers (or nanosheets). Monolayers may be crystalline, polycrystalline or amorphous. Preferably, the monolayers present in the two-dimensional nanomaterials produced herein are crystalline. The thickness of a monolayer will depend on the composition of the material. For example, a monolayer of graphene is generally one atom thick, whereas in other materials a monolayer may be formed of sandwiched sheets of atoms. A two-dimensional nanomaterial may comprise a single monolayer or a plurality of monolayers stacked together. Where more than one monolayer is present, the monolayers may be weakly bonded by van der Waals interactions. The two-dimensional nanomaterial may comprise from 1 to about 20 monolayers, for example from 1 to about 10 monolayers, for example from 1 to about 5 monolayers. The two-dimensional nanomaterial may have a thickness ranging from about 0.3 nm to about 10 nm, for example from about 0.3 nm to about 5 nm, for example from about 0.3 nm to about 2.5 nm. The dimensions of the two-dimensional nanomaterial and the number of monolayers present may be determined using techniques known in the art. The thickness of the structure in one dimension, out of the three, is generally sufficiently small for the quantum confinement to be substantial to give the materials additional properties distinctive from the bulk material. For example, the Raman spectroscopy signal of a given material may vary depending on the thickness of the material and thus can be used for characterisation. For graphene, these effects are visible up to tens of stacked carbon layers.

In an embodiment, the two-dimensional nanomaterial is graphene, a graphene derivative (for example doped graphene, graphene oxide, fluorographene or chlorographene), boron nitride or a transition metal chalcogenide. In an embodiment, the nanomaterial contains one or more lattice dopants or pyridinic species. Examples of suitable dopants for graphene include nitrogen, boron, phosphorus and silicon. Examples of pyridinic species include fluorine and chlorine.

More preferably, the two-dimensional nanomaterial is graphene. In particular, the present processes may be used to produce monolayer, bilayer or few-layer graphene. The term "monolayer" as used herein in connection with graphene refers to a single, atom-thick layer of graphene. A monolayer of graphene may be polycrystalline, in which case the lattice may have line defects or crystal boundaries. Alternatively, a monolayer of graphene may be a single crystal, in which case the lattice does not have line defects, but may include occasional point-defects (such as five- or seven-membered rings). The term "bilayer" refers to a graphene structure having two layers of graphene, with one overlying the other. The term "few-layer" refers to stacks of monolayers of graphene, typically up to tens of layers. Single-crystal or polycrystalline, monolayer, bilayer or few-layer graphene or their combinations may be produced by the present processes. The stacked layers need not be of the same size, morphology or coverage.

Similarly, monolayer, bilayer or few-layer two-dimensional nanomaterials other than graphene may be produced using a process of the present invention. The number of layers may change the electronic properties of said materials, such as bandgap, which is important for many applications (such as in electronics or photonics). An insulating two-dimensional nanomaterial, such as hexagonal boron nitride, will have different oxidation or corrosion resistance that can be tailored for protecting metal coatings.

The process of forming the two-dimensional nanomaterial by CVD will typically comprise contacting one or more precursors for the two-dimensional nanomaterial in the presence of the porous scaffold, and forming the two-dimensional nanomaterial thereon.

The precursor(s) are contacted with the porous scaffold for an appropriate period of time to enable one or more layers of the two-dimensional nanomaterial to form on a surface of the porous scaffold. In an embodiment, the one or more precursors can be a single-source or a multiple-source containing the chemical elements for the two-dimensional nanomaterial. Where the two-dimensional nanomaterial is graphene, the precursor(s) may include for example a precursor selected from alkanes (for example methane), alkenes, alkynes (for example acetylene), aromatic compounds (for example benzene) or polymers (for example polystyrene) may be used. Where the two-dimensional nanomaterial is boron nitride, a precursor selected from ammonia borane, borazine, decaborane/ammonia may be used. Exemplary precursors for transition metal chalcogenides nanomaterials include single-source organometallic precursors, as well as tungsten chlorides and sulfur (to synthesise $WS_2$) and molybdenum oxide and hydrogen sulfide (to form $MoS_2$).

Particularly where the two-dimensional nanomaterial is graphene, the process may comprise contacting the porous scaffold with hydrogen and a precursor for the two-dimensional nanomaterial (for example methane), wherein the contacting takes place under conditions such that the precursor reacts in the chamber to form said nanomaterial on the porous scaffold.

The precursor(s) are contacted with the porous scaffold for a suitable period of time for to achieve the desired coverage of the porous scaffold by the two-dimensional nanomaterial. Synthesis times of tens of minutes may be suitable to form monolayer nanomaterial coverage. Longer synthesis times may result in larger or thicker coverage. The two-dimensional nanomaterial content of the resulting composite material will also depend on other factors such as the surface area of the porous scaffold.

The two-dimensional nanomaterial is formed on one or more of the surfaces presented by the three-dimensional network of fused particles found in the porous scaffold. Thus, the two-dimensional nanomaterial will typically form on at least a portion of the surfaces presented by fused particles that are found within the bulk of the porous composite material, as well as on at least a portion of the surfaces presented by fused particles that are found at one or more external surfaces of the porous composite material.

In an embodiment, the process comprises forming the two-dimensional nanomaterial on at least 25% of the surface area of the porous scaffold, e.g. on at least 50% of the surface area of the porous scaffold, e.g. on at least 75% of the surface area of the porous scaffold, e.g. on at least 90% of the surface area of the porous scaffold. Preferably, the two-dimensional nanomaterial is formed on substantially all of the surface area of the porous scaffold.

In an embodiment, the two-dimensional nanomaterial is produced by atmospheric-pressure CVD (APCVD). That is, the CVD process is performed at a pressure that is substantially equal to (for example equal to) atmospheric pressure. In an embodiment, the two-dimensional nanomaterial is grown under a pressure of about 1 atm.

In an embodiment, the two-dimensional nanomaterial is produced by controlled chamber pressure chemical vapour deposition (CPCVD; for example high vacuum CVD [HVCVD]), ultra-high vacuum CVD (UHVCVD), or high pressure CVD (HPCVD). In a preferred embodiment, the CVD process may be performed at a pressure below atmospheric pressure, typically usually in the mTorr to tens of Torr pressure range. In an embodiment, the flows and the porous scaffold are contacted in the reaction chamber at defined pressure. The porous scaffold may be conditioned before synthesis of the two-dimensional nanomaterial in said controlled pressure chamber.

The temperature in the reaction chamber during formation of the two-dimensional nanomaterial may be any suitable temperature. The temperature will vary depending on the nature of the scaffold and/or the precursor(s) that are used. For instance, the temperature in the reaction chamber may range from about 100° C. to about 1700° C., for example from about 600° C. to about 1100° C. In a preferred embodiment, the temperature in the reaction chamber is from about 1000° C. to about 1100° C. The temperature may be maintained throughout the course of the process or it may be varied. Preferably the temperature is sufficiently low such that the porosity of the porous scaffold is substantially retained.

Facilitated CVD processes, aimed at reducing the synthesis temperatures or other improvements, such as increasing the growth rates, namely plasma-assisted CVD, UV-assisted CVD and pulsed-CVD may be employed in the present processes. Owing to their lower melting points, porous metal scaffolds are particularly suitable for use at lower temperatures than those employed for solid metal substrates. By way of illustration, solid Cu melts at 1085° C., whereas Cu particulates having an average diameter of 10-20 μm are observed to fuse at temperatures of approximately 1000° C. Increasing the temperature may result in higher growth rates, such that shorter synthesis times can be used.

The porous composite material may be cooled (for example to room temperature) prior to removing it from the reaction chamber. A fast cooling rate can be used to quench the growth of the two-dimensional nanomaterial.

In a preferred embodiment, the porous composite material is further processed so as to remove the metal from at least a portion of the composite material. More preferably, substantially all of the metal is removed from the composite material, yielding a porous structure formed of the two-dimensional nanomaterial. Thus, by further processing the porous composite material to remove the metal, porous two-dimensional nanomaterials such as porous graphene may be obtained.

The metal may be removed from the porous composite material by using an etchant, for example an acid (e.g. hydrochloric acid or nitric acid, optionally also in the presence of hydrogen peroxide) or a salt (e.g. iron (III) chloride or ammonium persulfate). After exposing the composite material to the etchant for the desired period of time, the etchant may then be removed from the solution using a solvent, e.g. an aqueous solvent such as water.

Techniques such as energy-dispersive X-ray spectroscopy (EDX) and X-ray photoelectron spectroscopy (XPS) may be used to determine the extent to which the metal scaffold has been etched from the two-dimensional nanomaterial.

In some instances, it may be desirable to preserve or support the structure of the resulting porous two-dimensional nanomaterial. This may be achieved by contacting the porous two-dimensional nanomaterial with a material which prevents the structure of the two-dimensional nanomaterial from collapsing when the solvent is removed. In one embodiment, supercritical drying may be used to preserve the porous two-dimensional nanomaterial structure. In another embodiment, polymer infusion may be used to provide additional support to the structure. Suitable polymers include poly(methyl methacrylate) (PMMA) and poly (dimethyl siloxane) (PDMS). In another embodiment, an organosilicon compound is used to support the structure. Exemplary organosilicon compounds include PDMS and tetraethyl orthosilicate (TEOS). In some embodiments, the organosilicon compounds may be processed to form aerogels or other ultralight structural materials.

In other embodiments, the porous composite material may be further processed so as to reduce its porosity. This may be advantageous in terms of improving the mechanical properties of the composite material. In particular, the porous composite material may be further processed to yield a composite material that is substantially non-porous.

The porosity of the composite material can be reduced by heating. In a preferred embodiment, the porous composite material is heated to a temperature below the melting point of the metal employed in the porous scaffold. Heating of the porous composite material may be performed in an inert atmosphere, e.g. in an argon or nitrogen atmosphere, so as to prevent degradation of the two-dimensional nanomaterial.

By way of illustration, and without limitation, various processes in accordance with the present invention are depicted schematically in FIG. 1. In the first step of the process shown in FIG. 1, a metal powder (a) is loaded into the reaction chamber of a CVD apparatus and heated. Metal atoms diffuse between the metal particles, producing thin necks (b) that widen depending on the time and temperature of the processing, eventually yielding a scaffold formed of fused metal particles (c). When the desired metal scaffold is obtained, a two-dimensional nanomaterial is then deposited on the scaffold. This may be achieved by introducing a precursor gas and other synthesis-specific gases (e.g. methane, argon and hydrogen may be used for graphene formation) into the CVD reaction chamber. The two-dimensional nanomaterial is then deposited on the surface of the metallic scaffold to yield a porous composite material (d). If desired, the resulting porous composite material may be further processed so as to modify the structure and/or properties of the material. For example, the porous composite material may be heat treated so as to reduce its porosity and produce a less porous composite (e). Alternatively, the porous composite material may be further processed so as to remove the metal from some or all of the composite material, yielding a porous material formed of the two-dimensional nanomaterial (f).

The materials produced by the present invention may be characterized using a number of known techniques, for example scanning electron microscopy, transmission electron microscopy, selected area electron diffraction and Raman spectroscopy. These techniques can be used to evaluate the two-dimensional structure of the nanomaterials, as well as the microstructure and chemical composition of the materials.

The surface of the porous composite materials prepared by the present processes may comprise flat or curved regions. The curvature of the surface is, however, negligible compared to the dimensions of the two-dimensional nanomaterial lattices. In the case of the porous two-dimensional nanomaterials, the nanomaterials may be folded in three dimensions.

The porous composite materials and the porous two-dimensional nanomaterials may have average pore sizes of from 10 nm to 100 µm, e.g. 1 µm or less, e.g. an average pore size of 0.5 µm to 1 µm. In particular, the porous two-dimensional nanomaterials may have smaller pore sizes than conventional two-dimensional nanomaterial foams. The pores may be substantially uniform or irregularly shaped.

The porosity of the materials may be measured using a variety of techniques known in the art. For example, electron microscopy may be used. Alternatively or additionally, porosity may be measured using nitrogen adsorption techniques, which provide information on the porosity of materials by relying on adsorption/desorption isotherms. By coating the metal scaffold with a two-dimensional nanomaterial, the metal may be protected from corrosion, oxidation or other chemical reactions. The composite materials may therefore find utility in high temperature applications, as well as structural applications or filtering. Depending on the two-dimensional nanomaterial employed in, the electrical and/or thermal conductivities of the metal may also be improved.

The porous composite materials and porous two-dimensional nanomaterials produced by the present processes may have increased surface areas and good electrical properties, and thus may find application in a variety of products. In particular, the materials may be employed in electrical devices or components, e.g. in electrodes, batteries or capacitors. In particular, porous graphene may be used in electrodes for lithium-air batteries. Similarly, composite materials which are substantially non-porous may be used in a variety of products, including electrical components such as electrical wires.

The porous two-dimensional nanomaterials may also be used as agents to deliver catalytic nanoparticles (e.g. $Co_3O_4$, $Mn_3O_4$, Pt or Au nanoparticles) to various substrates. In this case, the porous two-dimensional nanomaterials may be further processed to improve their interaction with the nanoparticles, e.g. by treating with an acid and/or by exposure to oxygen at elevated temperatures.

The following non-limiting Examples illustrate the present invention.

Example 1: Formation of a Copper-Graphene Porous Composite Material

A copper scaffold was first prepared by heating a copper powder in the furnace of a CVD chamber. Graphene was subsequently synthesised on the copper scaffold by CVD to form a porous composite material.

A copper powder composed of copper particles having a particle size of 14-25 μm and spheroidal shape (Sigma-Aldrich, 99% purity) was sonicated in hot (50° C.) acetone in an ultrasonic bath (Ultrawave model U1250D; 30-40 kHz) for 30 minutes to remove organic carbonaceous impurities. The acetone was then replaced by deionised water and sonicated for a further 30 minutes. The resulting wet powder was then dried in an oven at 100° C. for 12 hours.

15 g of the dried copper powder was loaded into an alumina boat with dimensions 80 mm×13 mm×9 mm, which was in turn loaded into the reactor tube of a CVD apparatus. The CVD apparatus consisted of a gas system of three gases: $CH_4$, $H_2$ (99.995% purity) and Ar (99.999% purity) controlled with mass flow controllers. The outlet line with the gas mixture was connected to a quartz tube (28 mm inner diameter) with ultra-torr fittings and the exhaust gas was let out through a bubbler with acetone. To allow heating and rapid cooling of the samples, the furnace (Elite TSH12/38/500) was shifted along the quartz tube.

The reactor tube was purged with Ar to remove residual air and the furnace was then pre-heated to 1030±5° C. Heating of the copper powder was started by introducing $H_2$ gas into the tube at a flow rate of 200 sccm and simultaneously shifting the furnace over the alumina boat containing the Cu powder. The heating process was conducted for 20 minutes, resulting in the formation of a porous copper scaffold.

The gas composition was then changed so as to start graphene synthesis. Graphene was synthesised using $CH_4$, which was introduced together with $H_2$. Without wishing to be bound by theory, it is believed that $H_2$ acts as an etchant of weak $sp^3$-hybridised bonds, thus biasing the CVD reaction towards crystalline $sp^2$-bonded carbon deposits, i.e. graphene. To achieve partial graphene coverage of the copper scaffold, the $CH_4$ and $H_2$ flows were introduced at 5.3 sccm and 300 sccm respectively (ratio≈60) for 30 minutes while the furnace was maintained at 1030±5° C., resulting in approximately 5 μm hexagonal graphene flakes. To achieve substantially full coverage of the copper scaffold, the synthesis time was extended to 90 minutes (see FIG. 2c), using the same ratio of $H_2$:$CH_4$. Increasing this ratio resulted in lower nucleation density and growth rate, thus increasing the size of the hexagons, provided the synthesis time was also increased. In order to obtain a porous composite material, the furnace was moved away from the alumina boat in the $CH_4/H_2$ atmosphere to quench graphene growth. After the sample had cooled down to room temperature, the system was purged with Ar and the sample removed.

Figure 2:
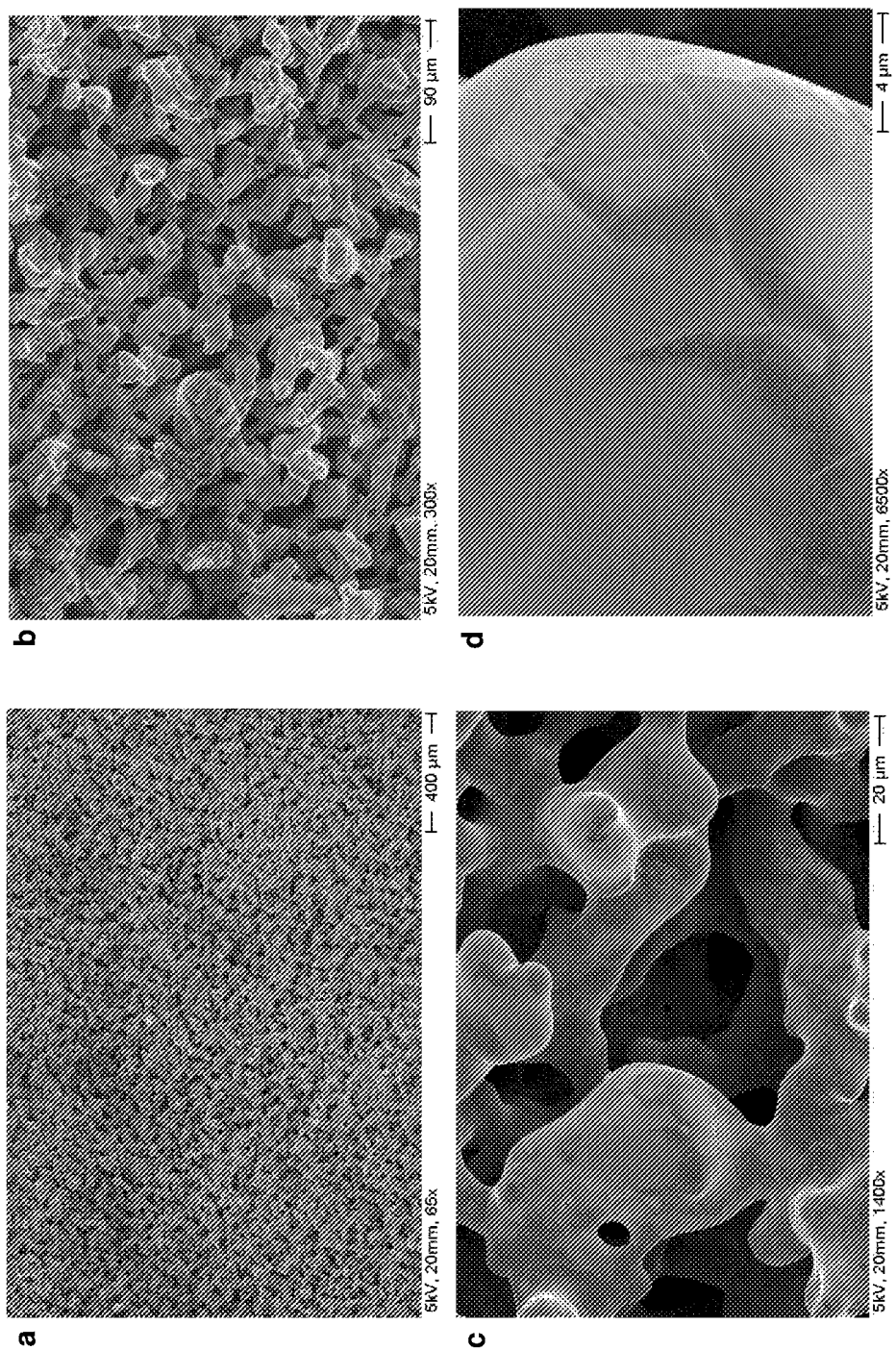
FIG. 2 shows the microstructure of a porous composite material comprising copper and graphene at different magnifications. The images were taken with a scanning electron microscope (SEM). Depicted are: (a) 65× magnification, showing the uniformity of the structure throughout; (b) 300× magnification, showing the porous three-dimensional metallic network; (c) 1400× magnification, illustrating a metallic scaffold geometry that is achievable by heating in a CVD system; and (d) 6500× magnification showing a hexagonal graphene flake before it coalesces with other flakes.

The resulting porous composite material was characterised by a variety of techniques, including SEM. FIG. 2 shows the microstructure of the porous composite material at different magnifications.

Example 2: Conversion of a Copper-Graphene Porous Composite Material to a Porous Graphene Material A copper-graphene porous composite material was prepared following the procedure described in Example 1, and then converted to a three-dimensional porous structure of graphene. In order to remove the copper from the composite material, the material was placed in a 1 M ammonium persulfate solution (prepared from 98%, $(NH_4)_2S_2O_8$, Sigma-Aldrich, that was dissolved in deionized water) for 48 hours. For more rapid etching of the copper, hot (e.g. 80° C.) ammonium persulfate or iron chloride could be used. When the copper was sufficiently etched, the graphene was visibly present in the etching solution in the form of a three-dimensional structure. After etching was complete, the etching solution was replaced by water to remove the salts from the graphene structure. This was done for 48 hours in total, with the water replaced after 24 hours.

The resulting porous graphene structure was characterised by TEM, SAED, Raman spectroscopy and SEM. TEM images and SAED patterns were recorded with a JEOL JEM-2010 microscope operating at 200 kV, while Raman spectra and maps were recorded with a Horiba LabRAM Aramis microscope equipped with a 532 nm laser. SEM characterization was done with a JEOL JSM-6500F microscope operating at 5 kV.

Figure 3:
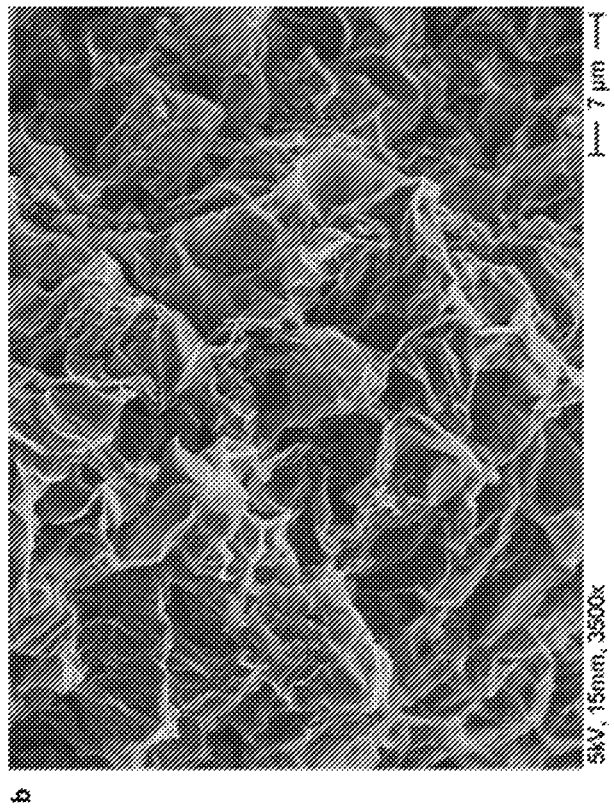
FIG. 3 shows the microstructure of folded porous graphene after the copper scaffold had been etched. Once again, the images were taken with an SEM. Depicted are: (a) a low magnification (230×) image showing a large self-supporting, rigid three-dimensional structure; and (b) a high magnification (2500×) image showing a membrane-like geometry.
Figure 3:
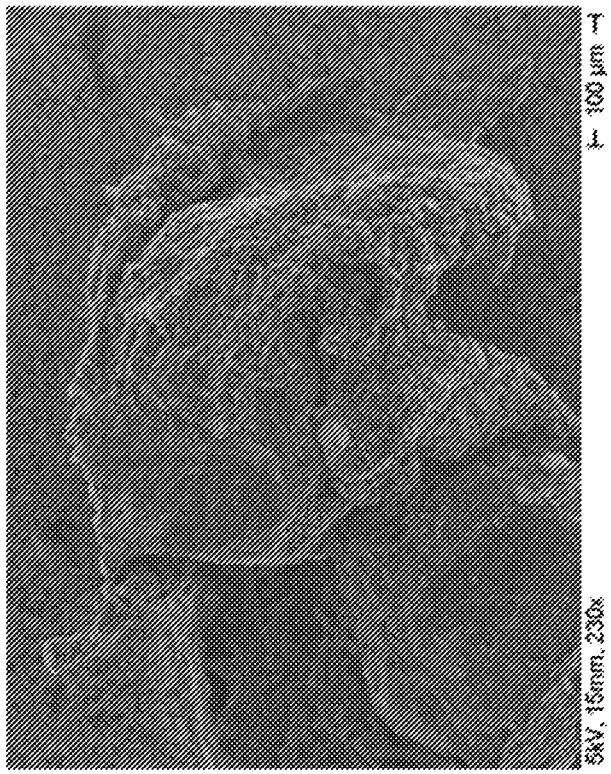
Figure 4:
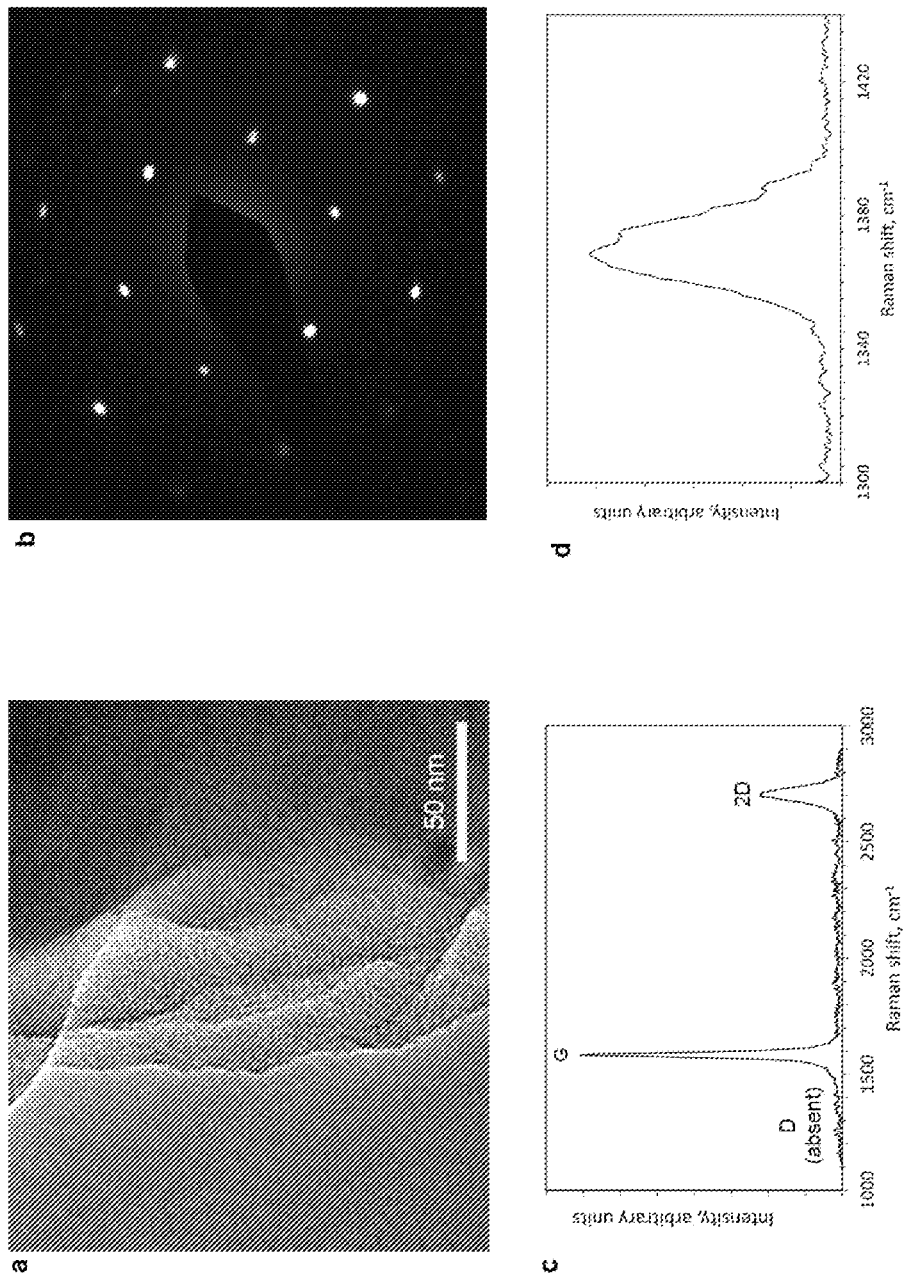
FIG. 4 shows additional characterization results. Shown are: (a) a transmission electron microscope (TEM) image of graphene, confirming the presence of folded structures having a high surface area; (b) selected area electron diffraction (SAED) images of a porous graphene sheet, confirming the hexagonal geometry; (c) a Raman spectrum of graphene, showing the absence of the D-peak (defect peak) at ~1350 $cm^{-1}$, and (d) a Raman spectrum of hexagonal boron nitride.

FIG. 3 provides SEM images showing the microstructure of the porous graphene structure at different magnifications. TEM images and Raman spectra of the graphene porous material are shown in FIG. 4. The procedure described above was found to result in the formation of graphene films that were approximately 3 layers thick. However, by using longer synthesis times and/or a higher $H_2$:$CH_4$ ratio, the process could be tailored to obtain bilayer or monolayer graphene.

Example 3: Conversion of a Copper-Graphene Porous Composite Material to a Composite Material of Reduced Porosity A copper-graphene composite material was prepared following the procedure described in Example 1. However, instead of cooling the material after formation of graphene, the reactor tube was purged with oxygen-free argon and the temperature of the furnace was raised to 1070° C. for 2 hours so that the copper scaffold restructured. The furnace was then slowly shifted away from the alumina boat so as to prevent thermal outer surface contraction, yielding a less porous copper-graphene composite material.

Example 4: Formation of a Nickel-Graphene Porous Composite Material

A nickel-graphene porous composite material was prepared following a similar procedure to that described in Example 1. A nickel powder composed of nickel particles having a particle size of 2.2-3 μm (99.9% purity, Alfa Aesar) was sonicated first in hot acetone and then deionised water, and subsequently dried. 5 g of the dried nickel powder was loaded into an alumina boat. The nickel powder was then heated using a 200 sccm $H_2$ flow at 1030±5° C. for 20 minutes. The $H_2$ flow was then changed to 5 sccm $CH_4$: 300 sccm $H_2$ for 30 minutes in order to synthesise graphene. The resulting porous composite material was cooled. Samples of the material were then further processed as described in Example 2 and Example 3.

Example 5: Formation of a Nickel-Hexagonal Boron Nitride Porous Composite Material Similar procedures to those described in the preceding Examples were used to produce a porous composite comprising nickel and hexagonal boron nitride. A nickel powder was cleaned, dried and heated as described in Example 4. Hexagonal boron nitride was then grown by lowering the temperature of the CVD furnace to 1000° C. A borazine vapour was prepared by heating 100 mg of an ammonia borane precursor (borane-ammonia complex, 97%, Sigma-Aldrich) to 100±2° C. in a quartz container before the inlet of the CVD reactor tube. The borazine vapour was carried by a 10 sccm flow of hydrogen, which was then diluted with 500 sccm of hydrogen in the CVD reactor tube. The flow was introduced via the reactor tube into the furnace which was heated to 1000° C. with the hot Ni scaffold. After a synthesis time of 30 minutes, the substrate was quenched by moving the furnace away from the substrate. The resulting porous composite material was then cooled. Samples of the material were then further processed as described in Example 2 and Example 3.

It will be understood that the present invention has been described purely by way of example, and modification of detail can be made within the scope of the invention. Each feature disclosed in the description, and where appropriate the claims and drawings, may be provided independently or in any appropriate combination.

The invention claimed is:

1. A process for preparing a porous composite material comprising a metal and a two-dimensional nanomaterial comprising 1 to 20 monolayers, said process comprising the steps of:
   providing a powder consisting of substantially pure metal particles, wherein an average particle size of the metal particles is from 100 nm to 100 μm;
   heating the powder to a temperature from 900° C. to 1100° C. for a time period of 5 minutes to 5 hours, such that the metal particles fuse to form a porous scaffold; and
   forming a two-dimensional nanomaterial on a surface of the porous scaffold by chemical vapour deposition (CVD), wherein the two-dimensional nanomaterial is formed at a temperature of from 100° C. to 1700° C.

2. The process according to claim 1, wherein the metal particles comprise a metal which catalyses formation of the two-dimensional nanomaterial.

3. The process according to claim 1, wherein the powder comprises particles of a transition metal.

4. The process according to claim 1, wherein the metal particles are substantially spherical.

5. The process according to claim 1, wherein: (i) the powder is heated in the presence of hydrogen; and/or (ii) the powder is heated in the reaction chamber of a CVD apparatus.

6. The process according to claim 1, wherein the two-dimensional nanomaterial is formed under atmospheric pressure.

7. The process according to claim 1, wherein the two-dimensional nanomaterial is selected from graphene, boron nitride and a transition metal chalcogenide.

8. The process according to claim 7, wherein the two-dimensional nanomaterial is graphene.

9. The process according to claim 1, wherein the process further comprises a step of forming a product comprising the porous composite material.

10. The process according to claim 1, wherein the process further comprises a step of removing the metal from at least a portion of the porous composite material.

11. The process according to claim 10, wherein the step of removing the metal comprises contacting the porous composite material with an etchant.

12. The process according to claim 10, wherein the process comprises removing substantially all of the metal from the porous composite material, thereby forming a porous two-dimensional nanomaterial.

13. The process according to claim 12, wherein the process further comprises a step of contacting the porous two-dimensional nanomaterial with a material which preserves the structure of the porous two-dimensional nanomaterial.

14. The process according to claim 12, wherein the process further comprises a step of forming a product comprising the porous two-dimensional nanomaterial, optionally wherein said product is an electrical component or device.

15. The process according to claim 1, wherein the process further comprises a step of converting the porous composite material to a composite material of reduced porosity, optionally wherein said step of converting comprises heating the porous composite material so as to reduce its porosity.

16. The process according to claim 15, wherein the material of reduced porosity is a substantially non-porous composite material.

17. The process according to claim 15, further comprising a step of preparing a product comprising the material of reduced porosity, optionally wherein said product is an electrical component or device.

18. A process for preparing a porous composite material comprising a metal and a two-dimensional nanomaterial comprising from 1 to 20 monolayers, said process comprising:
   providing a porous scaffold, wherein the porous scaffold is obtainable by heating a powder consisting of a substantially pure metal powder to a temperature of from 900° C. to 1100° C. for a time period of 5 minutes to 5 hours, such that the metal particles fuse to form said porous scaffold, wherein an average particle size of the metal particles is from 100 nm to 100 μm; and
   forming a two-dimensional nanomaterial on a surface of the porous scaffold by chemical vapour deposition (CVD), wherein the two-dimensional nanomaterial is formed at a temperature of from 100° C. to 1700° C.

* * * * *